United States Patent [19]
Parker et al.

[11] Patent Number: 6,118,285
[45] Date of Patent: Sep. 12, 2000

[54] NON-CONTACT PLASMA PROBE FOR TESTING ELECTRICAL CONTINUITY OF PRINTED WIRE BOARDS

[75] Inventors: Ronald W. Parker, Clinton; James W. Grace, Cromwell; Gerald W. Siter, East Haddam; Eli K. Dabora; John T. Bahns, both of Storrs; Baki Cetegen, Glastonbury, all of Conn.

[73] Assignee: Probot, Inc, Branford, Conn.

[21] Appl. No.: 09/036,341

[22] Filed: Mar. 6, 1998

Related U.S. Application Data

[60] Provisional application No. 60/072,829, Jan. 28, 1998.

[51] Int. Cl.$^7$ ............................................... G01R 31/302
[52] U.S. Cl. ........................ 324/750; 324/754; 324/537; 324/501
[58] Field of Search ................................ 324/500, 501, 324/537, 750–754, 758

[56] References Cited

U.S. PATENT DOCUMENTS

| | | | |
|---|---|---|---|
| 3,531,716 | 9/1970 | Tarui et al. | 324/51 |
| 3,772,520 | 11/1973 | Varker | 324/501 |
| 4,471,732 | 9/1984 | Tozzi | 123/143 |
| 4,573,008 | 2/1986 | Lischke | 324/501 |
| 4,578,279 | 3/1986 | Zinhger | 324/501 |
| 4,600,878 | 7/1986 | Doemens et al. | 324/51 |
| 4,705,329 | 11/1987 | Doemens | 324/73 |
| 4,766,855 | 8/1988 | Tozzi | 123/143 |
| 4,771,230 | 9/1988 | Zeh | 324/73 |
| 4,777,432 | 10/1988 | Doemons et al. | 324/73 |
| 4,967,149 | 10/1990 | Doemons et al. | 324/158.1 |
| 4,978,908 | 12/1990 | Mahant-Shetti et al. | 324/158.1 |
| 4,983,911 | 1/1991 | Henley | 324/158.1 |
| 4,985,681 | 1/1991 | Brunner et al. | 324/501 |
| 4,999,577 | 3/1991 | Beha et al. | 324/158.1 |
| 5,179,279 | 1/1993 | Millard et al. | 250/309 |
| 5,202,623 | 4/1993 | LePage | 324/158.1 |
| 5,268,645 | 12/1993 | Prokoff et al. | 324/537 |
| 5,371,459 | 12/1994 | Brunner et al. | 324/770 |
| 5,404,110 | 4/1995 | Golladay | 324/501 |
| 5,640,099 | 6/1997 | Sanada | 324/501 |
| 5,680,056 | 10/1997 | Ito et al. | 324/501 |
| 5,781,017 | 7/1998 | Cole et al. | 324/501 |

*Primary Examiner*—Diep N. Do
*Attorney, Agent, or Firm*—Todd E. Gerabedian; Gregory S. Rosenblatt; Wiggin & Dana

[57] ABSTRACT

A system for testing the electrical conductivity of printed traces, on multiple surfaces, of a printed wiring board using non-contacting probes. The non-contact probes generate a plasma in a plasma generating chamber that is used to apply a voltage to the printed wiring board. A measurement circuit determines the magnitude of the voltage on the printed wiring board.

18 Claims, 8 Drawing Sheets

NON-CONTACT PLASMA PROBE FOR TESTING ELECTRICAL CONTINUITY OF PRINTED WIRE BOARDS

CROSS-REFERENCE TO RELATED APPLICATIONS

This application claims the benefit of Provisional Application Ser. No. 60/072,829 filed Jan. 28, 1998.

BACKGROUND OF THE INVENTION

1. Field of the Invention

This invention relates to a system for testing electrical conductivity of electrical circuits; and more particularly, to a system that utilizes a non-contact plasma probe when testing electrical continuity and electrical shorts in circuit traces on printed wiring boards.

2. Description of the Prior Art

During the manufacturing process of printed wiring boards (PWBs) it is helpful to be able to test whether the printed circuit traces on the PWBs have electrical continuity from a starting point to a terminal point and are not shorted to adjacent circuit traces at any point along the printed circuit trace.

Conventional PWB testing means usually require a test probe to mechanically contact the PWB in order to perform the continuity test. Mechanical contact probes are inefficient because they require actual physical contact with each wiring trace that is to be tested. This process necessitates moving the conductive contact probes around to various locations on the printed wiring board. A probe physically moved by a preprogrammed X–Y coordinate mechanism is inefficient due to the number of rotations of either the probes or the PWB required to test the circuit traces. The "bed of nails" approach is also inefficient due to the number of physical contacts required by the probes on the PWB. These conventional mechanisms also have the drawback that as the size of components on the PWB have decreased the likelihood of damage to the PWB components, as a result of testing by contact probes has greatly increased. In an effort to avoid damage caused by probes impacting upon a PWB, non-contact probes have been developed. Present methods of non-contact testing include the following prior art patents.

U.S. Pat. No. 5,202,623 (LePage) discloses a laser-activated plasma chamber for non-contact testing. This reference discloses employing a laser-activated plasma in a metallic chamber that makes electrical connection to a node under test. This process utilizes a laser device to generate a plasma, which is then used to detect presence or absence of electrical current. This method requires a laser to generate the plasma and is inefficient because of the high energy requirements of the laser.

U.S. Pat. No. 5,179,279 (Millard et al.) discloses a non-contact electrical pathway. This patent discloses a method for establishing a signal pathway to and from a circuit through a conductive surface on the circuit by utilizing a laser beam to generate a plasma. The focused laser beam is directed towards a surface of a foil and forms a hole in the foil that yields a strand or a stream of plasma on the opposite side of the foil. A positioning mechanism is used to place a spot of the plasma on the surface of the board. The board is then laterally moved so that the spot of plasma can be selectively brought to the surface of conductive areas or paths, which represent circuit board connections. This method requires the use of a laser, which necessitates high energy consumption. This method further requires the additional apparatus of an optical system, a focusing lens and a foil to implement the system.

U.S. Pat. No. 5,268,645 (Prokoff et al.) discloses testing a circuit board by using an array of electrodes. A non-homogenous electric field is applied to the array and signals denoting the characteristics of the electric potential are generated.

As can be seen from the present state of the art, there exists a need for an improved method of testing conductivity of printed traces that does not require a laser. It would be desirable to utilize a single conductive stationary mechanically contacting probe and at least one non-contacting plasma probe such that the speed of the testing procedure would be increased and fragile elements on the PWB would not be damaged by moving a physically contacting probes about the PWB.

BRIEF SUMMARY OF THE INVENTION

The present invention increases the speed and accuracy by which the electrical integrity of printed traces on PWBs is determined. One embodiment of the present system has a single conductive probe mechanically contacting a PWB at a single location and at least one non-contacting probe that does not physically contact the conductive traces of a PWB. A current sensing device is coupled between the conductive probe and the non-contacting probe for determining the amount of current passing through a conductive trace under test.

The system also includes a voltage source that enables the printed wiring board to receive an initial voltage. The non-contact probe makes electrical contact with the PWB by expelling a plasma. This plasma can be generated in a plasma generating chamber that has at least one electrode through the chamber for providing an electrical charge for the gas or liquid medium in the chamber. The system may also include a flow restrictor that maintains a desired pressure of the fluid as well as a pulse generating circuit that is coupled to the chamber for providing a pulse for generating a plasma. A second embodiment of the present system is directed to a system having a plurality of non-contacting probes that do not physically contact the PWB.

DETAILED DESCRIPTION

Printed wiring boards (PWBs) have numerous applications in electronic components. In order to determine whether or not a printed wiring board has been fabricated properly it is necessary to determine whether the printed traces properly conduct electrical current from the beginning of the trace to the end of the trace. It is necessary to test the integrity of a trace without the testing apparatus damaging the PWB.

The present invention discloses a new and improved system for testing electrical conductivity of traces on printed wiring boards. This system utilizes a plasma jet, or stream as a conductive medium between the measurement system and the PWB under test. In addition, the system uses a single mechanically contacting probe physically connected to the PWB to provide electrical connection to the PWB in a single location. This connection provides a ground element to the circuit created during the testing procedure. The use of a single mechanically contacting probe reduces the risk of damage to the printed wiring board since the physically contacting probe is not repeatedly moved about the PWB.

A non-mechanically contacting plasma probe may then be systematically moved about the PWB without being in physical contact with the circuit traces on the PWB. This feature enables the testing to be performed at a desired trace location on the PWB without physical contact by the probe with any trace or component on the PWB. This testing procedure will not damage or destroy any fragile elements on the wiring board. The testing procedure may also be performed with a plurality of non-contacting probes without the mechanically contacting probe.

Figure 1:
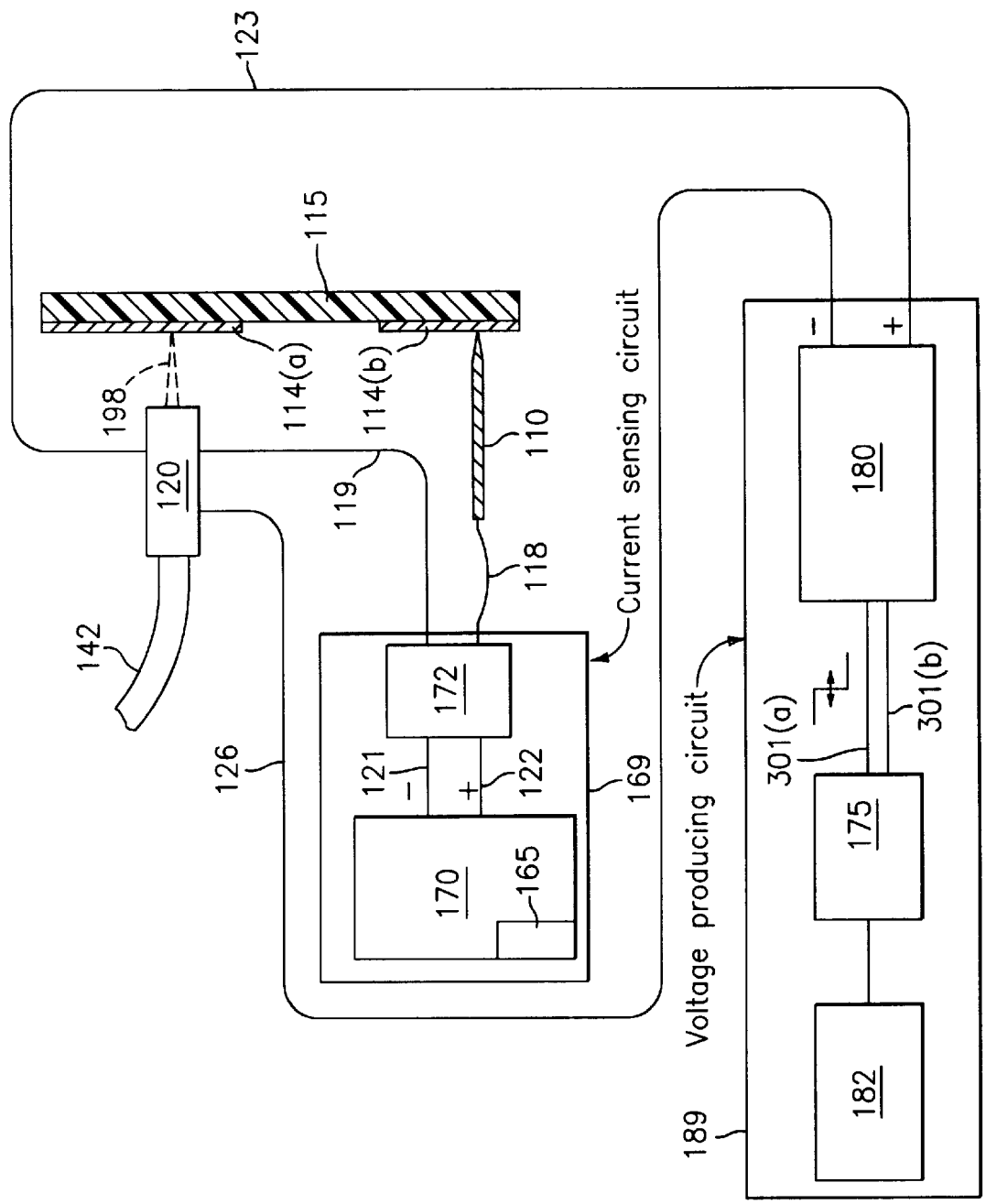
FIG. 1 shows a single non-contact probe and a contact probe for detecting trace conductivity.

FIG. 1 shows a conducting mechanical contact probe 110 connected to the printed wiring board 115, which has circuit traces 114(a) and 114(b). Circuit traces 114(a) and (b) may be different locations on the same trace or separate traces. The placement of the probes on the traces 114(a) and (b) depends upon the type of test being performed.

Once in place, the contact probe 110 is stationary and need not be moved to a second location on the PWB while the conductivity of the circuit traces 114 is determined. The mechanically contacting probe 110 is connected to a current sensing circuit 169 by wire 118.

The current sensing circuit 169 includes measurement circuit 172 and a current source 170. The current source 170 includes an oscillator 165. The oscillator 165 generates an A.C. signal with a frequency from approximately 30 hertz to approximately 20 megahertz. A typical amplitude range would be between approximately 0.5 millivolts and 1000 volts. The oscillator 165 enables the testing of a trace 114 to be performed using A.C. signals.

The measurement circuit 172 is connected to the current source 170 by wires 121 and 122. Wire 122 is connected to the positive terminal of the current source 170 and wire 121 is connected to the negative terminal of the current source 170. The electrical potential driving the current from the current source 170 may be in the range of 200 to 700 volts DC. Current is passed from the current source 170 to the measurement circuit 172 through wire 121. Current is passed from the current sensing circuit 169 to the non-contact probe 120 through wire 119.

The non-contact probe 120 receives fluid through fluid tube 142. Fluid tube 142 is connected to a fluid source (not shown).

A voltage producing circuit 189 includes a trigger, pulse generator and pulse power amplifier. Trigger 182 is connected to a pulse generator 175, which is connected to a pulse power amplifier 180 by wires 301(a) and 301(b). Wire 126 connects the negative terminal of pulse power amplifier 180 to non-contact probe 120 thereby providing a pulse of energy to non-contact probe 120. The positive terminal of pulse power amplifier 180 is connected to the non-contact probe 120 via wire 123.

The non-contact probe 120 produces a plasma 198 that electrically connects the non-contact probe 120 to PWB 115. In one embodiment, the PWB 115 becomes charged, it takes on capacitive characteristics and may be referred to as a P.C. board capacitor or PWB network. In this mode, the P.C. board exhibits characteristics of a capacitor that is located between two or more physically unconnected networks. One of these networks may consist of a ground or power plane. Another of these networks may consist of a printed circuit trace. The printed circuit trace network may traverse multiple layers of the PWB. This enables a measurement of the relative capacitive characteristics or discharge characteristics.

The conducting mechanical contact probe 110 does not have to be moved. However, the contact probe 110 may be moved to physically contact a different location on PWB 115.

Tests may be performed by placing the probes at different locations on the same trace and based on a measurement of current, determine whether there is a path for current to flow along the trace. The entire length of a trace may be tested by placing the probes at either end of a trace under test.

Figure 2:
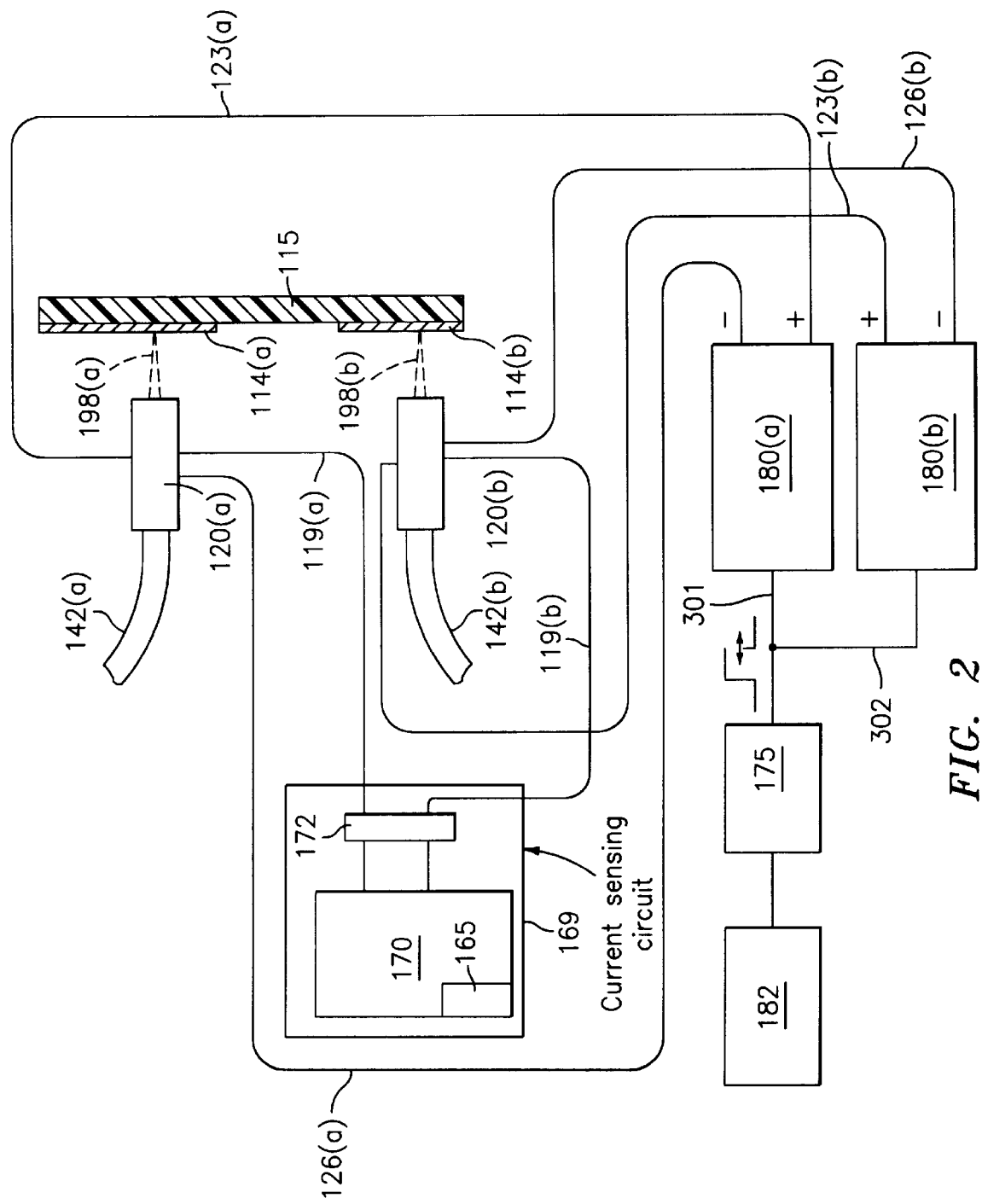
FIG. 2 shows a plurality of non-contacting probes for detecting trace conductivity.

FIG. 2 shows a second embodiment that utilizes a plurality of non-contacting probes 120(a), 120(b) to perform a conductivity test of circuit traces 114(a) and (b) on a PWB 115. The components of non-contacting probe 120(b) are identical to those of 120(a). Each probe has an associated pulse power amplifier 180(a), 180(b). Wires 301 and 302 connect the associated pulse power amplifier to the pulse generator 175. Wires 301 and 302 have two components as shown in wire 301(a) and (b) of FIG. 1.

In this embodiment two plasmas 198(a) and 198(b) can be generated by a corresponding non-contact probe 120(a) and 120(b). Plasmas 198(a) 198(b) are used to form paths between ends of a printed circuit trace to be tested. A difference of potential is placed across both plasmas and includes the printed traces to be measured. The potential is placed across the circuit so that a current flows through each of the plasmas as well as through the trace being tested. The amount of current that passes through the plasmas and the trace is measured over a finite period of time. Based upon the total current, a determination is made whether the trace is carrying sufficient current for circuitry to be attached to the PWB. In this embodiment the non-contact probes are moved about the PWB producing plasmas that contact the traces to be tested.

Figure 3:
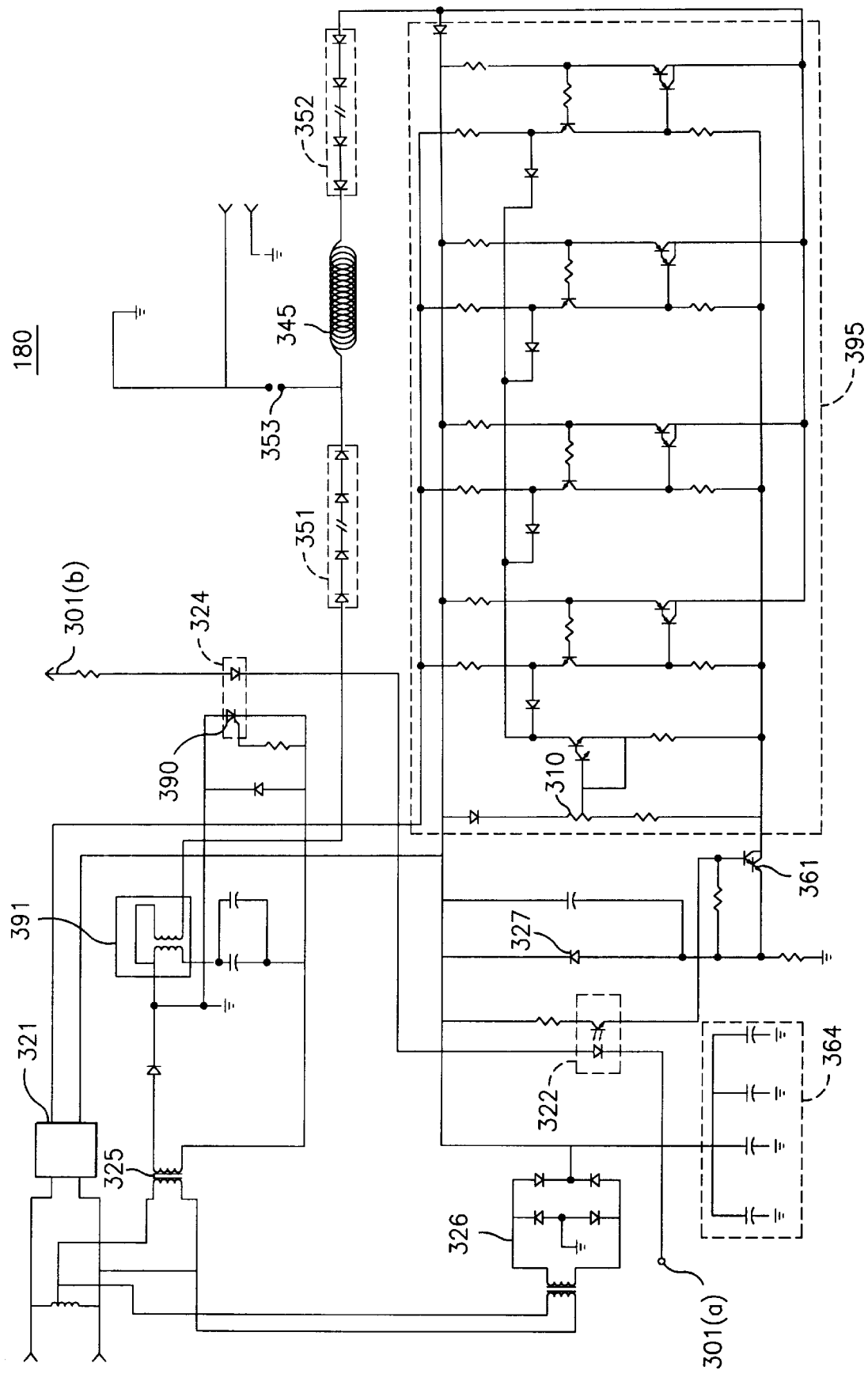
FIG. 3 is a schematic diagram of pulse amplifier circuitry.

FIG. 3 shows the circuitry of the pulse power amplifier 180 of FIG. 1, which provides a pulse that is applied to the non-contact probe to generate a plasma.

When a pulse is applied to the inputs 301(a) and (b) of pulse amplifier 180, it causes a first optical coupling device 322 and a second optical coupling device 324 to energize. A silicon controlled rectifier (SCR) 390 in optical coupling device 324 turns "on" and causes a pulse to be generated by a high pulse generating circuit 391. This pulse has a magnitude of approximately 2,000 volts, which appears across load 353. Load 353 may be the electrode of the non-contact probe (not shown). This high voltage pulse is buffered by diode blocking array 351. At the same time a bias current through a Darlington transistor 361 is allowed to flow to a high current generating circuit 395. The transistor 361 provides a current path to variable resistor 310 of the high current generating circuit 395. Resistor 310 also limits the amount of current out of high current generating circuit 395.

After a period of about 30 microseconds, the high voltage spike produced by SCR 390 decays to a lower level and only the high current generating circuit 395 continues to provide energy to the load 353. This constant current continues until the pulse to optical coupling device 324 and optical coupling device 322 is discontinued, or until the power supply capacitors 364 are discharged.

Incoming pulses from wires 301(a) and 301(b) are isolated from three power supplies 321, 325, and 326 through optical coupling devices 322 and 324.

Power supply 321 is a DC power supply, of approximately 12 volts, and is used in conjunction with diode 327 to provide bias current to high current generating circuit 395. Once transistor 361 is triggered, a current path to resistor 310 is established.

A second power supply 326 supplies current to high current generating circuit 395. Power supply 326 is a DC voltage source that provides a voltage of between 150 and 250 volts. Power supply 326 utilizes filter capacitors 364.

A third power supply is a transformer 325 that provides DC power to the high pulse generating circuit 391. Power supply 325 ranges from 150 volts to 250 volts in magnitude.

A Zener diode 327 derives power from power supply 326 and supplies power to the drive circuitry, which includes transistor 361 and variable resistor 310, which drives high current generating circuit 395. Transistor 361 is also used as a power switch and is able to interrupt current to the high current circuit 395. Transistor 361 can allow or interrupt the high current output from the high current generating circuit 395.

The transistor side of optical coupling device 322 is used to turn transistor 361 fully "on" or fully "off". Therefore, output current to load 353 can be controlled by the external circuitry of the trigger (not shown) and pulse power amplifier circuit 180.

The total output current for the high current generating circuit 395 is connected to the load 353 through the high voltage blocking diode array 352. The blocking diode array 352 protects the high current section from the 2,000 volt DC spikes of voltage produced by SCR 390. A radio frequency choke 345 also helps to prevent these high voltage spikes from damaging the high current generating circuit 395.

Figure 4:
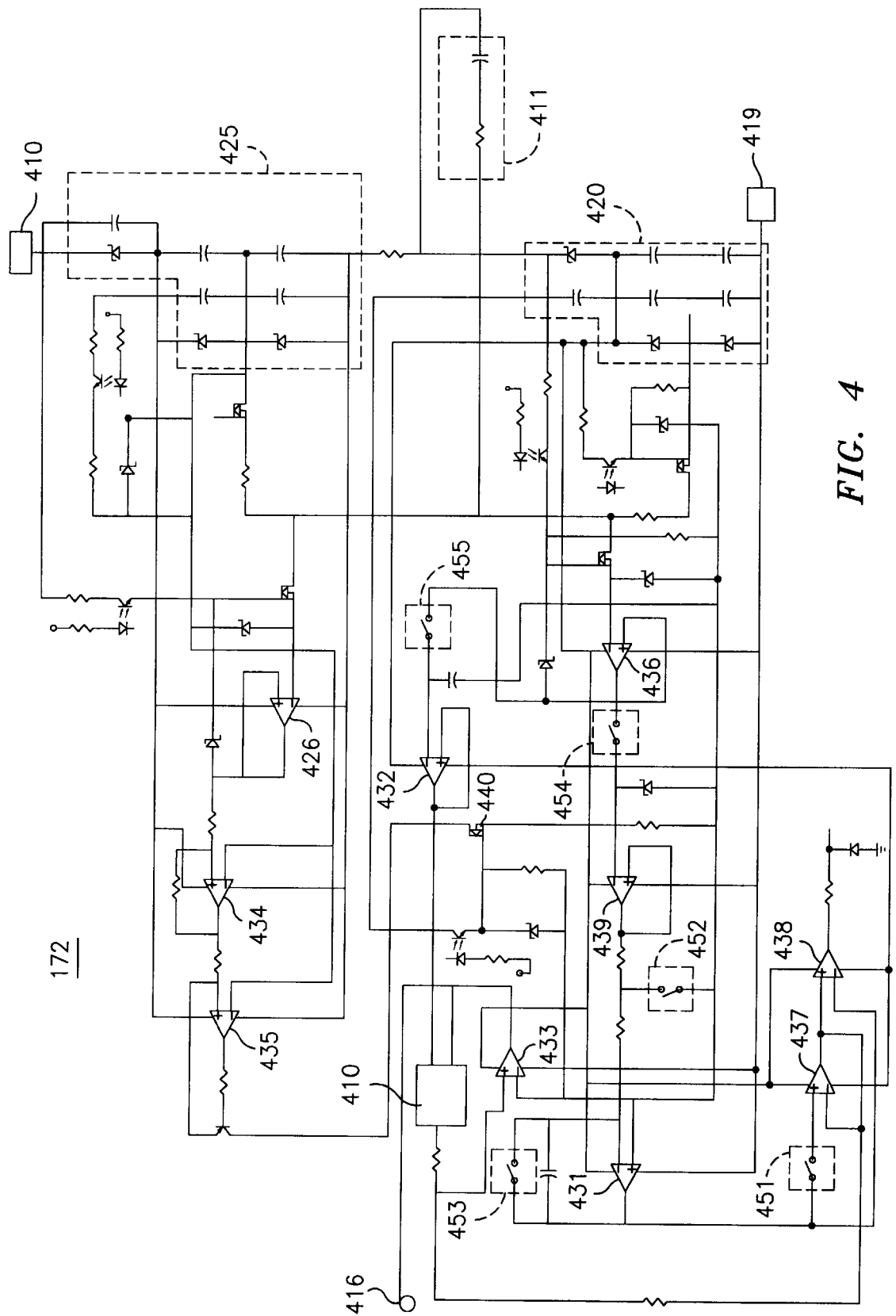
FIG. 4 shows a schematic of a measuring circuit.

FIG. 4 shows measurement circuit 172, which is used to perform an electrical continuity test of a PWB. A voltage is applied across the PWB by the non-contact probe that receives a pulse from an associated pulse amplifier. (An example of the pulse amplifier is shown in FIG. 1.) This charges the PWB and traces, which are represented by PWB network 411. When the PWB network 411 is charged, it takes on capacitive characteristics. PWB network 411 represents the capacitance that is to be measured and thus enable the electrical conductivity of a trace to be determined. A positive DC supply 418 and a negative DC supply 419, of equal magnitude, are used as measurement circuit voltage sources. The magnitude of supplies 418 and 419 is between 250 and 500 volts. Two other DC supplies 420 and 425 are generated from the DC supplies 419 and 418, respectively. Supply 420 is arranged to produce a power supply for operational amplifiers 431 and 437 and multiplexor 410. Supply 425 produces power for operational amplifiers 426, 434 and 435.

A FET transistor 440 measures the current stored in PWB network 411 at the time of discharge of the PWB network 411. The measurement output 416 may be connected to an A/D converter (not shown) and stored in memory (not shown). The PWB network 411 is discharged using voltage source 419 to eliminate interference with subsequent tests. In order to quantify adequately the amount of current that has to be measured for a given period of time, the following equations may be used:

$$Q=CV$$

where

Q=coulombs of charge;

C=capacitance;

V=voltage across the printed wiring board between probes on the PWB and $$CV=It$$

where

I=current in Amperes t=time in seconds

Thus Q=It and

C=It/V.

Figure 5:
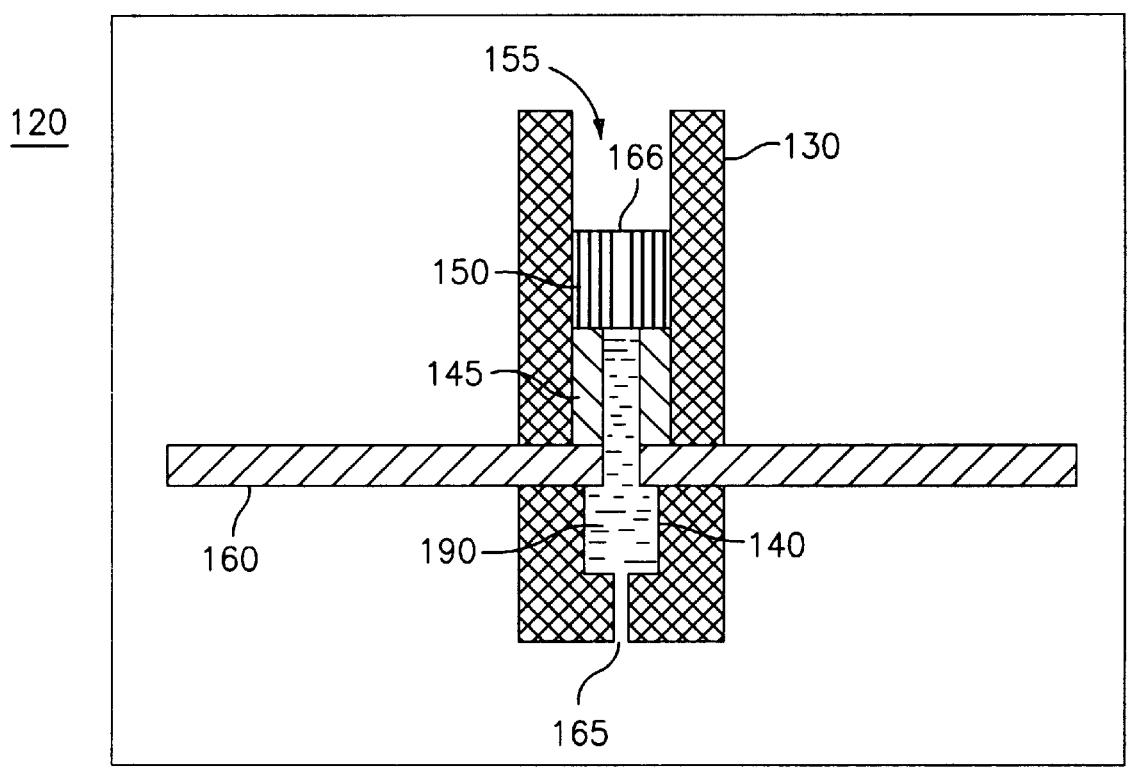
FIG. 5 shows a plasma-producing chamber of a non-contact probe.

FIG. 5 shows that the non-contact probe 120 may be a plasma probe. This plasma probe includes a chamber body 130 that forms a chamber volume 190 to contain a fluid 140. The chamber body 130 is typically a non-metallic material and may be a ceramic material with a displacement of about 100 cubic millimeters. The fluid 140 may be a gas, such as argon or nitrogen. A desirable fluid is one that can replenish itself a desired percentage after every pulse. The chamber body 130 also has an inlet port 155 into which the fluid 140 is forced. The chamber body 130 also has a flow restrictor 150 that may be fabricated from a porous material such as sintered aluminum. The restrictor 150 maintains a pressure gradient between fluid inside the chamber area and the ambient air outside of the chamber area. The degree of restriction depends upon the porosity of the flow restrictor 150.

The fluid 140 enters the chamber volume 190 through an inlet orifice 166, which can range in diameter from approximately 0.001 and 0.015 inches. An insulating layer 145, such as ceramic, provides a layer of thermal and plasma insulation between the chamber volume 190 and the chamber body 130. Disposed within the chamber body and extending into the chamber volume 190 is an electrode 160. The electrode may be made of any electrically conductor material such as tungsten.

At the terminal end of the chamber body 130 is an outlet orifice 165 for the expulsion of plasma generated in the chamber volume 190, which is disposed within chamber body 130. The outlet orifice 165 can range in diameter from approximately 0.0005 to 0.006 inches. The magnitude of the diameter of the outlet orifice 165 is a function of the spatial distribution of plasma required for a particular application. As the dimensions of the traces decreases, the diameter of the outlet orifice should also decrease.

The plasma is generated by a high-energy pulse being released into the chamber volume 190 over a finite period of time.

In order to facilitate the production of ions (e.g. modify the plasma characteristics) in the chamber volume, a chemical seedant, such as cesium, can be added.

Figure 6:
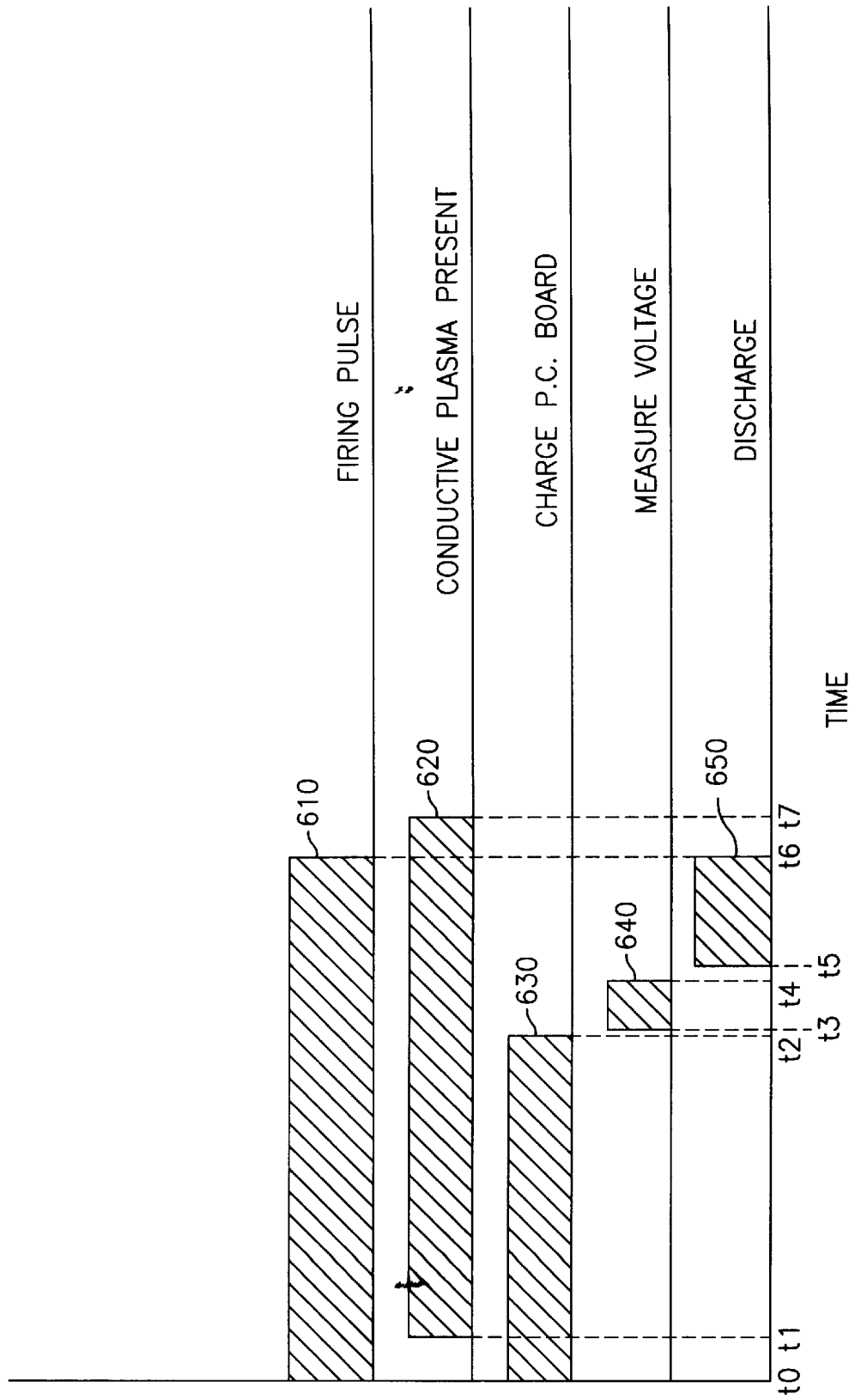
FIG. 6 is a timing diagram for one cycle of a continuity test performed by the present system.

FIG. 6 shows a timing diagram for one test cycle. The cycle begins at "t0", with a firing pulse. The PWB network, which comprises the PWB and traces, begins to charge. It should be noted that there will be little charge transferred to the PWB network between "t0" and "t1" because the resistance of the plasma path is very high. That is, a low resistance path has not yet been established. At "t1", which is approximately 50 microseconds after "t0", the desired conductive plasma path has been established. (This conductive path has relatively low-resistance.)

During the time between time period "t1" and "t2", a precise amount of charge is placed on the PWB network.

Between time "t2" and "t3" there is a brief period that is used to switch from the circuitry used to charge the PWB network to the circuitry that will measure the voltage across the PWB network.

During the time between "t3" and "t4", a measurement is made of the voltage level to which the PWB network has charged.

The time between "t4" and "t5" is used to switch from the measurement circuitry to the discharge circuitry.

Time "t5" begins the discharge cycle of the PWB network. The same amount of charge that was put on the PWB network is now removed. The rate at which the charge is removed may be more rapid than the rate at which the charge was put on the PWB network. Therefore, there is a shortened discharge period between "t5" and "t6". Although the measurement is done at the end of "t6", the conductive plasma persists for approximately 30 microseconds after the measurement is complete. This time is represented as time period "t6" to "t7".

Figure 7:
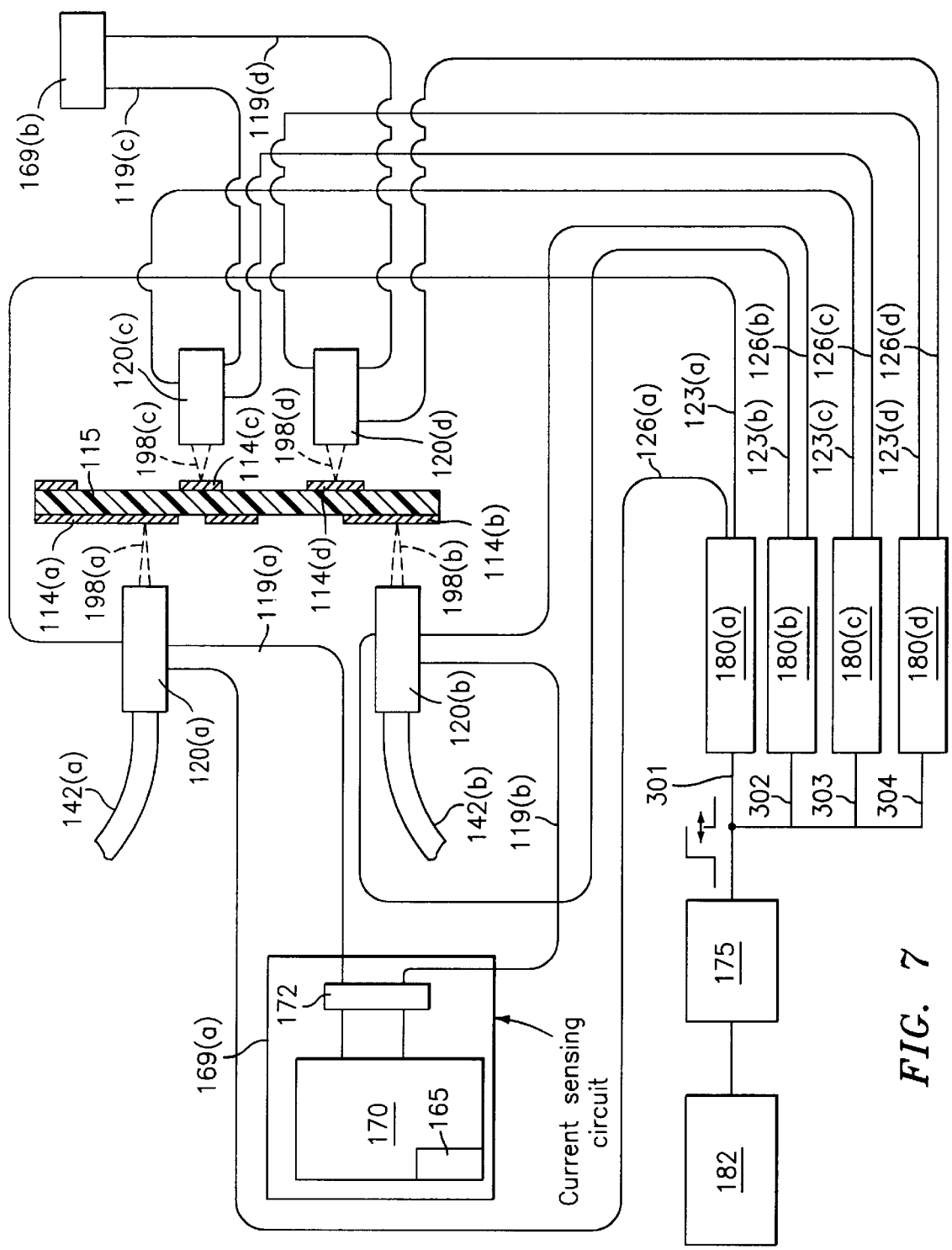
FIG. 7 shows testing two surfaces of the PWB during a single test session.

FIG. 7 shows that two surfaces of the PWB may be tested simultaneously. The figure shows four probes 120(a), (b), (c) and (d), two on each side of the PWB. The number of probes may be any number that may be placed on the PWB. Each probe has an associated pulse power amplifier 180(a), (b), (c) and (d). The wires 123(a), (b), (c) and (d) and wires 126(a), (b), (c) and (d) connect an associated pulse power amplifier to an associated probe.

Figure 8:
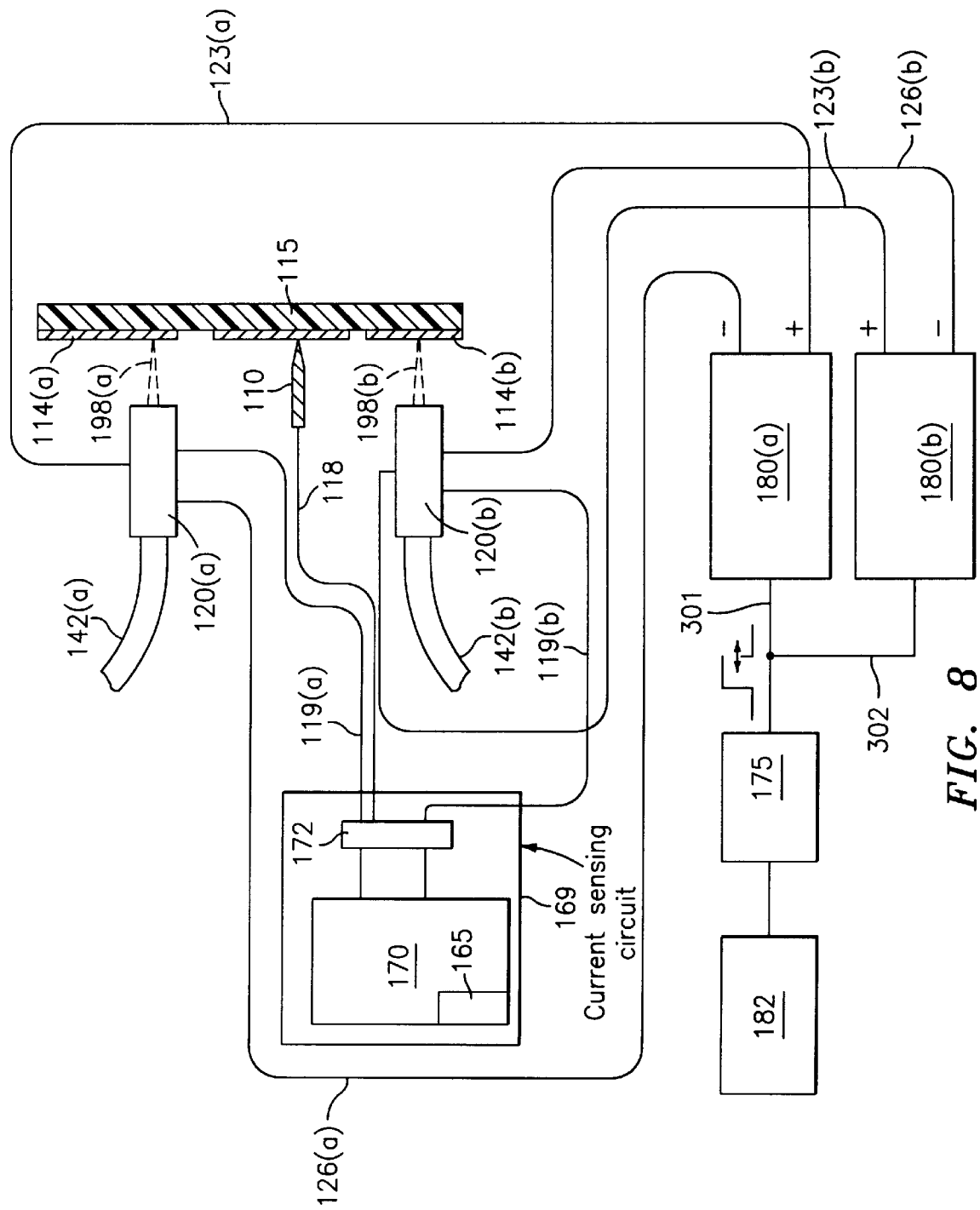
FIG. 8 shows a plurality of non-contacting probes and a contact probe for detecting trace conductivity.

FIG. 8 shows an embodiment of the present invention that utilizes two non-contact probes 120(a) and 120(b) in conjunction with a mechanically contacting probe 110. In this embodiment the speed of the test is increased by using a plurality of non-contact probes 120(a) and (b) to test electrical conductivity through a printed trace 114.

While the preferred embodiments of the present invention have been illustrated in detail, it should be apparent that modifications and adaptations to those embodiments may occur to those skilled in the art without departing from the scope of the present invention as set forth in the following claims.

What is claimed is:

1. An apparatus for testing the electrical continuity between a first trace and a second trace on a printed wire board, comprising:
    a first probe in electrical and mechanical contact with said first trace on said printed wire board;
    a second probe comprising a plasma, said plasma in electrical and non-mechanical contact with said second trace on said printed wire board;
    a current sensing circuit comprising a current source and a measurement circuit, said current sensing circuit in electrical communication with said first probe and said second probe; and
    a voltage-producing circuit for supplying voltage to said second probe to generate said plasma;
    wherein said current source of said current sensing circuit establishes a current between said first probe, said first trace, said second trace, and said plasma of said second probe, and said current measurement circuit determines the electrical continuity of said circuit.

2. The apparatus of claim 1, wherein said second probe further comprises a non-metallic chamber and a fluid input tube for supplying a fluid to generate said plasma.

3. The apparatus of claim 2, wherein said fluid is selected from the group consisting of argon, nitrogen, and combinations thereof.

4. The apparatus of claim 2, wherein said second probe further comprises one or more electrodes disposed through said non-metallic chamber for providing an electrical charge to said fluid, thereby producing said plasma.

5. The apparatus of claim 1, wherein said voltage-producing circuit further comprises a pulse generating circuit in electrical communication with said non-metallic chamber for producing a pulse for generating said plasma.

6. The apparatus of claim 5, wherein said pulse generating circuit further comprises a high current generating circuit and a high voltage pulse-generating circuit.

7. The apparatus of claim 2, wherein said second probe further comprises a flow restrictor for maintaining a desired pressure of said fluid.

8. The apparatus of claim 7, further comprising a chemical seedant disposed in said chamber for producing ions when subjected to an electrical charge from said electrode.

9. The apparatus of claim 8, wherein said chemical seedant is cesium.

10. An apparatus for testing the electrical continuity between traces on a printed wire board, comprising:
    a plurality of probes, each of said probes comprising a plasma, said plasma in electrical and non-mechanical contact with one of said traces on said printed wire board;
    a current sensing circuit comprising a current source and a measurement circuit, said current sensing circuit in electrical communication with at least two of said probes; and
    a voltage-producing circuit for supplying voltage to one of said plurality of probes to generate said plasma;
    wherein said current source of said current sensing circuit establishes a current between said probes and said traces, and said current measurement circuit determines the electrical continuity of said circuit.

11. The apparatus of claim 10, wherein each of said probes further comprise a non-metallic chamber and a fluid input tube for supplying a fluid to generate said plasma.

12. The apparatus of claim 11, wherein said fluid is selected from the group consisting of argon, nitrogen, and combinations thereof.

13. The apparatus of claim 11, wherein each of said probes further comprise one or more electrodes disposed through said non-metallic chamber for providing an electrical charge to said fluid, thereby producing said plasma.

14. The apparatus of claim 10, wherein said voltage-producing circuit further comprises a pulse generating circuit in electrical communication with said non-metallic chamber for producing a pulse for generating said plasma.

15. The apparatus of claim 14, wherein said pulse generating circuit further comprises a high current generating circuit and a high voltage pulse-generating circuit.

16. The apparatus of claim 11, wherein each of said probes further comprise a flow restrictor for maintaining a desired pressure of said fluid.

17. The apparatus of claim 13, further comprising a chemical seedant disposed in said chamber for producing ions when subjected to an electrical charge from said electrode.

18. The apparatus of claim 17, wherein said chemical seedant is cesium.

* * * * *